(12) United States Patent
Kurachi

(10) Patent No.: US 8,547,256 B2
(45) Date of Patent: Oct. 1, 2013

(54) ANALOG UNIT

(75) Inventor: Haruyuki Kurachi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 74 days.

(21) Appl. No.: 13/254,204

(22) PCT Filed: May 29, 2009

(86) PCT No.: PCT/JP2009/059890
§ 371 (c)(1),
(2), (4) Date: Sep. 1, 2011

(87) PCT Pub. No.: WO2010/137168
PCT Pub. Date: Dec. 2, 2010

(65) Prior Publication Data
US 2011/0316730 A1 Dec. 29, 2011

(51) Int. Cl.
*H03M 1/06* (2006.01)

(52) U.S. Cl.
USPC ........... 341/118; 341/119; 341/120; 341/121; 341/155

(58) Field of Classification Search
USPC .......................................... 341/118–121, 155
See application file for complete search history.

(56) References Cited

U.S. PATENT DOCUMENTS

| | | | | |
|---|---|---|---|---|
| 5,196,851 A | * | 3/1993 | Patel et al. | 341/140 |
| 5,844,512 A | * | 12/1998 | Gorin et al. | 341/139 |
| 6,449,517 B1 | * | 9/2002 | Lee | 700/83 |
| 6,452,518 B1 | * | 9/2002 | Kawabata | 341/118 |
| 6,891,491 B2 | | 5/2005 | Nakamura et al. | |
| 6,911,924 B2 | | 6/2005 | Kurachi et al. | |
| 7,084,795 B2 | * | 8/2006 | Smith et al. | 341/120 |
| 7,148,828 B2 | * | 12/2006 | Fernandez et al. | 341/120 |
| 8,077,065 B2 | * | 12/2011 | Iso et al. | 341/139 |
| 2003/0063020 A1 | * | 4/2003 | Masenas et al. | 341/120 |
| 2004/0150455 A1 | * | 8/2004 | Kurachi et al. | 327/334 |

FOREIGN PATENT DOCUMENTS

| | | |
|---|---|---|
| JP | 03-179919 A | 8/1991 |
| JP | 05-259909 A | 10/1993 |
| JP | 10-145231 A | 5/1998 |
| JP | 3403127 B2 | 2/2001 |
| JP | 2001-203579 A | 7/2001 |
| JP | 4074823 B2 | 9/2004 |
| JP | 2005-244294 A | 9/2005 |
| JP | 2005-244771 A | 9/2005 |
| JP | 3969391 B2 | 6/2007 |
| WO | 03/065588 A1 | 8/2003 |

OTHER PUBLICATIONS

Japanese Office Action, Aug. 28, 2011.

* cited by examiner

*Primary Examiner* — Linh Nguyen
(74) *Attorney, Agent, or Firm* — Sughrue Mion, PLLC

(57) ABSTRACT

An ADC code given in response to input of an analog input value to an A/D converter circuit is measured at a site where an A/D converter unit is used to measure a user-measured value. A user-set value calculating part calculates a user offset value and a user gain value on the basis of one user-measured value, a factory offset value, and a factory gain value, and stores the calculated user offset value and the user gain value in a nonvolatile memory.

11 Claims, 13 Drawing Sheets

ANALOG UNIT

CROSS REFERENCE TO RELATED APPLICATIONS

This application is a National Stage of International Application No. PCT/JP2009/059890 filed May 29, 2009, the contents of all of which are incorporated herein by reference in their entirety.

FIELD

The present invention relates to an analog unit, and more specifically, to a method of calibrating an output value of the analog unit.

BACKGROUND

An output value of an analog unit is calibrated in order to correct nonuniformity in conversion characteristics between channels. As a general way of calibration of an output value of the analog unit, measurement is taken at two points to obtain an offset value and a gain value, and these two points are approximated by a straight line.

Patent Literature 1 discloses a method of compensating for nonlinearity during A/D conversion. In this method, a range from Vmin to Vmax of an input voltage to be applied to an A/D converter is divided into regions 1 and 2 with respect to a middle voltage Vc. Then, approximation is made along an approximate straight line L11 in the region 1, and along an approximate straight line L12 in the region 2.

Patent Literature 2 discloses a method of calibrating an output value of an analog unit without measuring an offset value and a gain value. In this method, a user offset value in conformity with the channel of an A/D converter unit is corrected or calculated on the basis of a factory offset value, a factory gain value and a user offset value of a source of succession, and a factory offset value and a factory gain value stored in a nonvolatile memory.

In a method disclosed in Patent Literature 3, an A/D-converted value corresponding to a digital value to be output is calculated in advance for each digital value by using a reference digital value obtained as a result of conversion of a reference analog signal by an A/D converter. Then, the A/D-converted value, and a raw digital signal obtained as a result of conversion of an analog signal by the A/D converter are compared.

CITATION LIST

Patent Literature

Patent Literature 1: Japanese Patent No. 4074823
Patent Literature 2: Japanese Patent No. 3969391
Patent Literature 2: Japanese Patent No. 3403127

SUMMARY

Technical Problem

The method of approximating two points including an offset value and a gain value by a straight line requires measurement at two points to obtain the offset value and the gain value, resulting in a large number of man-hours.

In the method disclosed in Patent Literature 1, approximation is made along the approximate straight line L11 in the region 1, and along the approximate straight line L12 in the region 2. This requires measurement at three points to obtain an offset value and a gain value, resulting not only in a large number of man-hours but also in greater unevenness in calibration accuracy.

The method disclosed in Patent Literature 2 achieves high calibration accuracy if an analog signal and an ADC code are linearly correlated with each other. However, calibration accuracy decreases if the analog signal and the ADC code cannot be correlated linearly.

The method disclosed in Patent Literature 3 is employed effectively as a method of correcting an output value in response to a temperature drift and the like. Meanwhile, this method requires a data table to store an A/D-converted value in an address format or in a format corresponding to a digital value, and a comparator circuit to compare a raw digital signal obtained as a result of conversion of an analog signal by the A/D converter and the A/D-converted value stored in the data table, resulting in cost increase.

The present invention has been made in view of the foregoing issues. It is a first object of the invention to provide an analog unit capable of calibrating an output value while preventing increase of man-hours required for measurement even if an analog signal and an ADC code are correlated with each other in a nonlinear manner.

It is a second object of the present invention to provide an analog unit capable of reducing unevenness in calibration accuracy even if an analog signal and an ADC code are correlated with each other in a nonlinear manner.

It is a third object of the present invention to provide an analog unit capable of correcting an output value in response to a temperature drift while preventing cost increase.

Solution to Problem

In order to solve the above problem and in order to attain the above object, an analog unit of the present invention, includes: a converter circuit for converting an input value to an output value; a storage part for storing two factory-set values representing a relationship between the input value and the output value before calibration; and a user-set value calculating part for calculating two user-set values representing a relationship between the input value and the output value after calibration on the basis of one user-measured value representing the relationship between the input value and the output value before calibration, and the two factory-set values.

Advantageous Effects of Invention

The present invention can provide an analog unit capable of calibrating an output value while preventing increase of man-hours required for measurement even if an analog signal and an ADC code are correlated with each other in a nonlinear manner.

DESCRIPTION OF EMBODIMENTS

Figure 1:
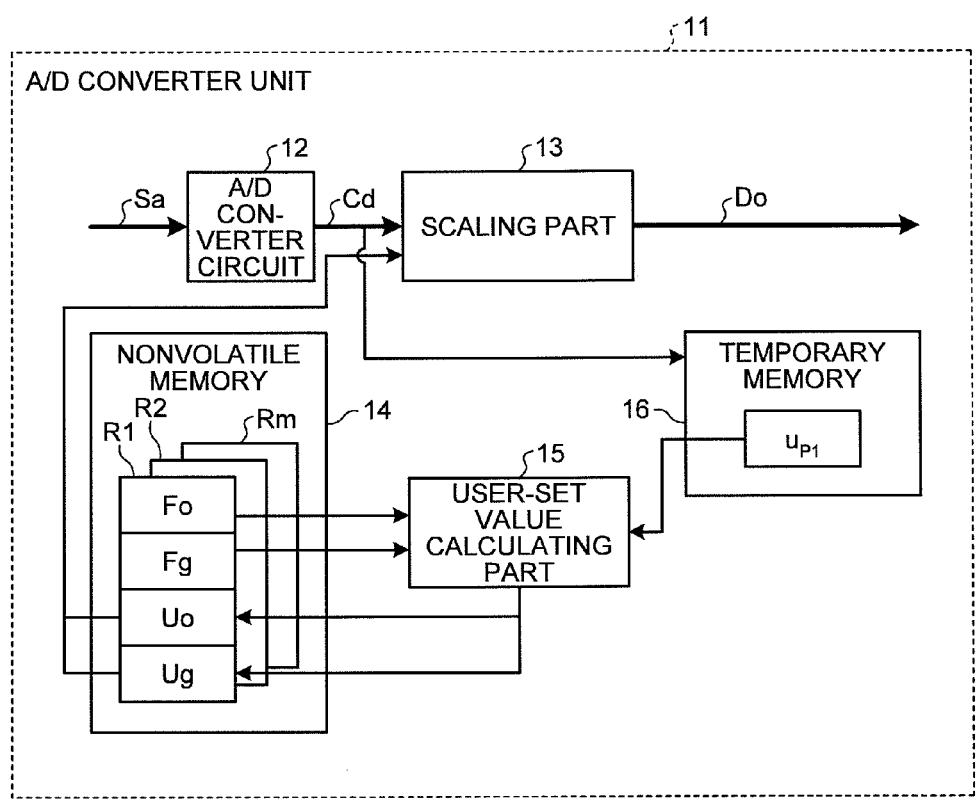
FIG. 1 is a block diagram of the schematic configuration of a first embodiment applied to an analog unit according to the present invention.

Embodiments of an analog unit according to the present invention will be described in detail below on the basis of the drawings. The embodiments are not intended to limit the invention. The analog unit includes an A/D converter unit and a D/A converter unit, and the A/D converter unit is mainly described below as an example. However, the analog unit should not be limited to the A/D converter unit First Embodiment FIG. 1 is a block diagram of the schematic configuration of a first embodiment applied to an analog unit according to the present invention. An A/D converter unit 11 shown in FIG. 1 includes an A/D converter circuit 12, a scaling part 13, a nonvolatile memory 14, a user-set value calculating part 15, and a temporary memory 16.

The A/D converter circuit 12 can convert an analog input value Sa to an ADC code (digital-converted value) Cd. One A/D converter unit 11 may include, for example, A/D converter circuits 12 with four to eight channels. A channel means a functional unit of a plurality of A/D converter circuits 12 placed in one A/D converter unit 11.

The scaling part 13 can compress and decompress the ADC code Cd to a digital output value Do according to a user's range. The scaling part 13 can calibrate the A/D converter unit 11 to compensate for nonuniformity in A/D conversion characteristics between channels. The calibration of the A/D converter unit 11 means control to allow output of the desired digital output value Do in response to input of the analog input value Sa in the form of a voltage or a current, for example. The scaling part 13 can refer to a user offset value Uo and a user gain value Ug stored in the nonvolatile memory 14 in order to calibrate the A/D converter unit 11.

The nonvolatile memory 14 can store two factory-set values and two user-set values for each of user ranges R1 to Rm. The factory-set values can represent a relationship between the analog input value Sa and the ADC code Cd (namely, the digital output value Do before calibration). The two factory-set values to be given may include a factory offset value Fo and a factory gain value Fg.

The user-set values can represent a relationship between the analog input value Sa and the digital output value Do. The two user-set values to be given may include the user offset value Uo and the user gain value Ug.

The factory offset value Fo and the factory gain value Fg can be set at a factory when the A/D converter unit 11 is manufactured. The factory offset value Fo is an ADC code to be output in response to application of the lowest offset voltage defined in the specifications and used for scaling in a manufacturing factory. The factory gain value Fg is an ADC code to be output in response to application of the highest gain voltage defined in the specifications and used for scaling in the manufacturing factory.

The user offset value Uo and the user gain value Ug can be set at a site where a user uses the A/D converter unit 11. The user offset value Uo is an ADC code to be output in response to application of the lowest offset voltage defined in the specifications and used for scaling at the site of use. The user gain value Ug is an ADC code to be output in response to application of the highest gain voltage defined in the specifications and used for scaling at the site of use.

An offset voltage is the lowest value of a voltage to be input as the analog input value Sa on a specific channel of the A/D converter unit 11. The offset voltage is an input voltage that allows the digital output value Do to be output a minimum in response to the value of the input voltage. For example, the digital output value Do to be output is made zero if it is to be scaled to fit a range of from 0 to 4000. A gain voltage is the highest value of a voltage to be input as the analog input value Sa on a specific channel of the A/D converter unit 11. The gain voltage is an input voltage that allows the digital output value Do to be output a maximum in response to the value of the input voltage. For example, the digital output value Do to be output is made 4000 if it is to be scaled to fit a range of from 0 to 4000. To be specific, if a voltage to be input as the analog input value Sa is between 0 V to 5 V, the offset voltage becomes 0 V, and the gain voltage becomes 5 V.

The user-set value calculating part 15 can calculate the user offset value Uo and the user gain value Ug on the basis of one user-measured value $u_{P1}$, and the factory offset value Fo and the factory gain value Fg, and store the calculated user offset value Uo and the user gain value Ug in the nonvolatile memory 14. The user-measured value $u_{P1}$ can be measured at a site where the user uses the A/D converter unit 11. The user-measured value $u_{P1}$ can represent a relationship between the analog input value Sa and the ADC code Cd (namely, the digital output value Do before calibration).

The temporary memory 16 can store one user-measured value $u_{P1}$ measured at the site where the user uses the A/D converter unit 11. The scaling part 13, the nonvolatile memory 14, the user-set value calculating part 15, and the temporary memory 16 may be realized by a microcomputer.

The ADC code Cd given in response to input of the analog input value Sa to the A/D converter circuit 12 is measured in the manufacturing factory of the A/D converter unit 11. Then, the factory offset value Fo and the factory gain value Fg are measured, and the measured factory offset value Fo and the factory gain value Fg are stored in the nonvolatile memory 14. It is assumed, for example, that a voltage ranging between 0 V and 10 V is given as the analog input value Sa to the A/D converter unit 11. In this case, the ADC code Cd given in response to application of a voltage of 0 V as the analog input value Sa is stored as the factory offset value Fo in the nonvolatile memory 14. At the same time, the ADC code Cd given in response to application of a voltage of 10 V as the analog input value Sa is stored as the factory gain value Fg in the nonvolatile memory 14.

Next, the ADC code Cd given in response to input of the analog input value Sa to the A/D converter circuit 12 is measured at the site where the A/D converter unit 11 is used. Then, the user-measured value $u_{P1}$ is measured, and is then stored in the temporary memory 16. As an example, the ADC code Cd given in response to application of a voltage of 5 V as the analog input value Sa is stored as the user-measured value $u_{P1}$ in the temporary memory 16.

After the user-measured value $u_{P1}$ is stored in the temporary memory 16, the user-set value calculating part 15 calculates the user offset value Uo and the user gain value Ug on the basis of the user-measured value $u_{P1}$, the factory offset value Fo, and the factory gain value Fg. The calculated user offset value Uo and the user gain value Ug are stored in the nonvolatile memory 14.

The analog input value Sa given to the A/D converter circuit 12 is converted to the ADC code Cd, and is then given to the scaling part 13. After the ADC code Cd is given to the scaling part 13, the ADC code Cd is scaled to the digital output value Do by referring to the user offset value Uo and the user gain value Ug stored in the nonvolatile memory 14.

It is assumed, for example, that the analog input value Sa in a range of from 1 V to 5 V allows the digital output value Do to fall in a range of from 0 to 4000 when the output value Do is output. In this case, the digital output value Do representing a voltage currently applied can be output on the basis of the ADC code Cd obtained when an offset voltage is 1 V, the ADC code Cd obtained when a gain voltage is 5 V, and the ADC code Cd obtained from a voltage currently applied.

The digital output value Do may be obtained from the following formula (1):

$$Do=(Cd-Uo)/(Ug-Uo) \times Sg+So \qquad (1)$$

where So and Sg are minimum and maximum values respectively of the digital output value Do to be output in response to scaling of the ADC code Cd.

The scaling by the scaling part 13 can smooth out nonuniformity in the respective characteristics of the A/D converter circuits 12. It is assumed, for example, that there are channels A and B. At the channel A, the ADC code Cd of 100 is output when a voltage of 0 V is applied to the A/D converter circuit 12, and the ADC code Cd of 8000 is output when a voltage of 10 V is applied to the A/D converter circuit 12. At the channel B, the ADC code Cd of 105 is output when a voltage of 0 V is applied to the A/D converter circuit 12, and the ADC code Cd of 8020 is output when a voltage of 10 V is applied to the A/D converter circuit 12. In this case, the user offset value Uo and the user gain value Ug at the channel A are set at 100 and 8000, respectively, and the user offset value Uo and the user gain value Ug at the channel B are set at 105 and 8020, respectively. Then, the digital output value Do is scaled to fit a range of from 0 to 4000. As a result, at both of the channels A and B, the digital output value Do of zero can be output in response to application of a voltage of 0 V to the A/D converter circuit 12, and the digital output value Do of 4000 can be output in response to application of a voltage of 10 V to the A/D converter circuit 12.

Thus, the A/D converter unit 11 can be calibrated at the site where the A/D converter unit 11 is used by measuring one user-measured value $u_{P1}$. This can improve the conversion accuracy of the A/D converter unit 11 while preventing increase of man-hours required for measurement even if the analog input value Sa and the ADC code Cd are correlated with each other in a nonlinear manner.

Figure 2:
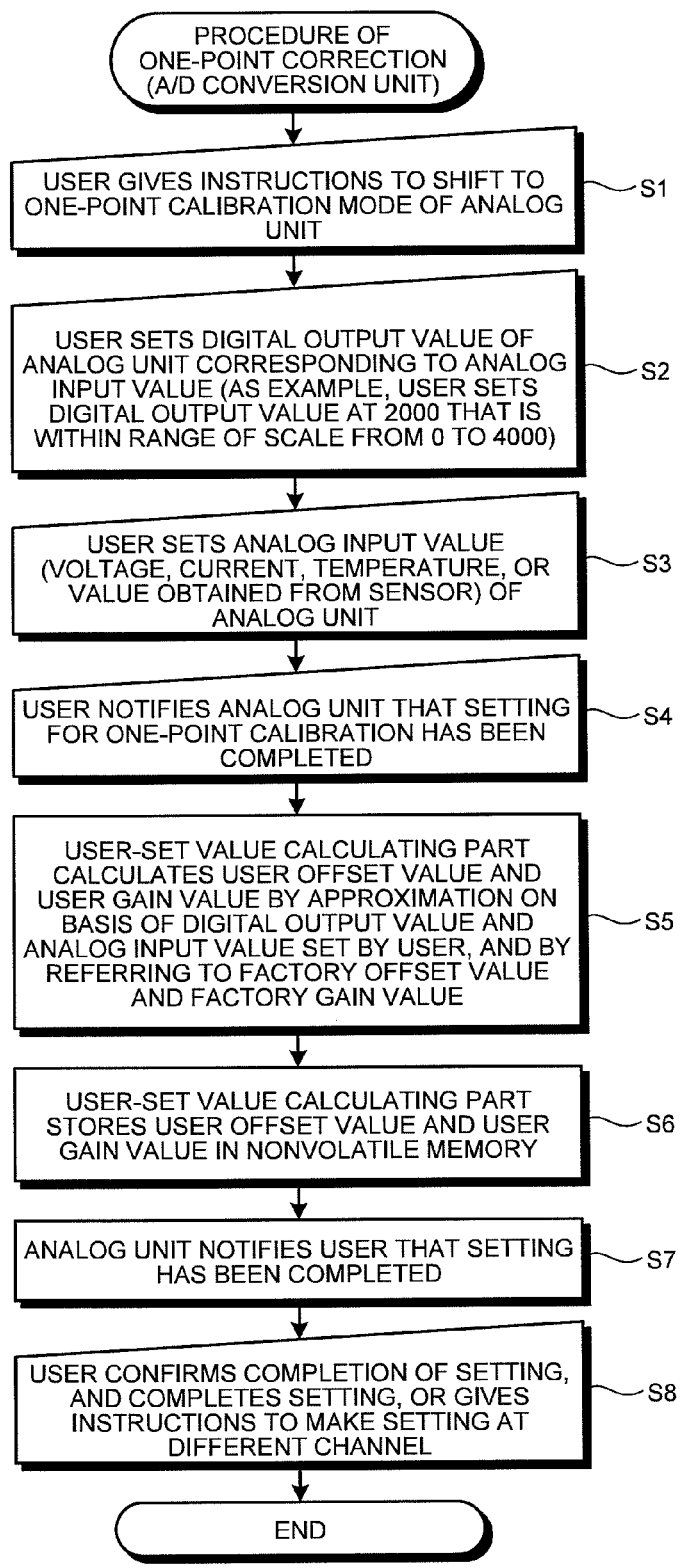
FIG. 2 is a flow chart explaining a method of calibration of the analog unit shown in FIG. 1.

FIG. 2 is a flow chart explaining the method of calibration of the analog unit shown in FIG. 1. In FIG. 2, at a site where a user uses the analog unit (A/D converter unit 11 in the example of FIG. 1), the user gives instructions to shift to a one-point calibration mode of the analog unit (step S1).

Next, the user sets the digital output value Do of the analog unit corresponding to the analog input value Sa (step S2). As an example, the user may set the digital output value Do at 2000 that is within a range of scale from 0 to 4000.

Next, the user sets the analog input value Sa of the analog unit (step S3). The analog input value Sa may be a value obtained from various sensors such as a temperature sensor. Further, the analog input value Sa may be represented as a voltage or a current.

The user thereafter notifies the analog unit that setting for the one-point calibration has been completed (step S4).

Next, while referring to the factory offset value Fo and the factory gain value Fg stored in the nonvolatile memory 14, the user-set value calculating part 15 calculates the user offset value Uo and the user gain value Ug on the basis of the analog input value Sa and the digital output value Do set by the user (step S5).

The user-set value calculating part 15 thereafter stores the user offset value Uo and the user gain value Ug in the nonvolatile memory 14 (step S6).

Next, the analog unit notifies the user that setting of the user offset value Uo and the user gain value Ug has been completed (step S7).

The user thereafter confirms that the setting of the user offset value Uo and the user gain value Ug has been completed. Then, the user instructs the analog unit to make setting at a different channel (step S8).

Second Embodiment

Figure 3:
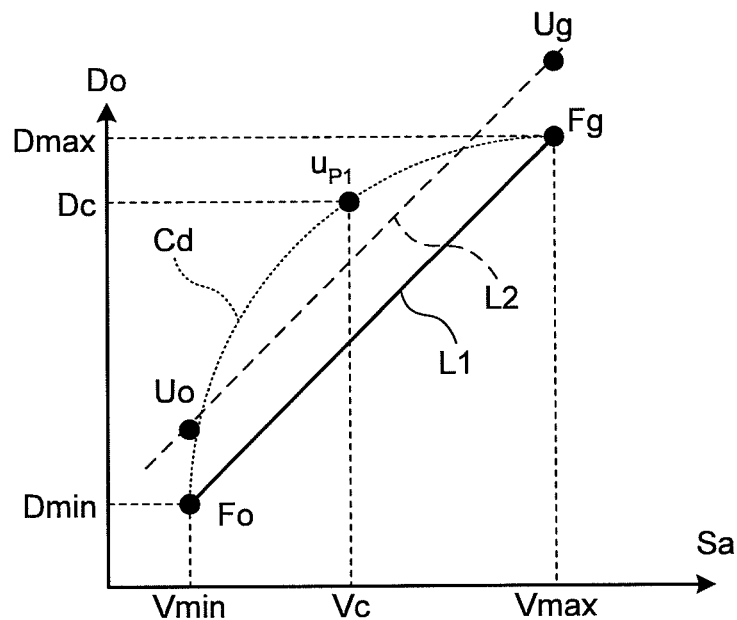
FIG. 3 shows a method of calibration of a second embodiment implemented in the analog unit according to the present invention.

FIG. 3 snows a method of calibration of a second embodiment implemented in the analog unit according to the present invention. As shown in FIG. 3, it is assumed that the output characteristics of an ADC code Cd are represented by a curve.

An ADC code Dmin given in response to application of an offset voltage Vmin to the A/D converter circuit 12 is measured as a factory offset value Fo, and an ADC code Dmax given in response to application of a gain voltage Vmax to the A/D converter circuit 12 is measured as a factory gain value Fg in a manufacturing factory of the A/D converter unit 11.

Further, an ADC code Dc given in response to application of an input voltage Vc to the A/D converter circuit 12 is measured as a user-measured value $u_{P1}$ at a site where the A/D converter unit 11 is used, and is then stored in the temporary memory 16 of FIG. 1.

After the user-measured value $u_{P1}$ is stored in the temporary memory 16, the user-set value calculating part 15 calculates a straight line L2 along which a residual sum of squares between each of the factory offset value Fo and the factory gain value Fg, and the user-measured value $u_{P1}$ is minimized. Next, the user offset value Uo and the user gain value Ug are specified on the straight line L2, and are then stored in the nonvolatile memory 14.

Thus, a margin of error can be made equal throughout the range by measuring one user-measured value $u_{P1}$ at the site where the A/D converter unit 11 is used. As a result, standards for linearity of the A/D converter unit 11 can be relaxed while increase of man-hours required for measurement is prevented.

Third Embodiment

Figure 4:
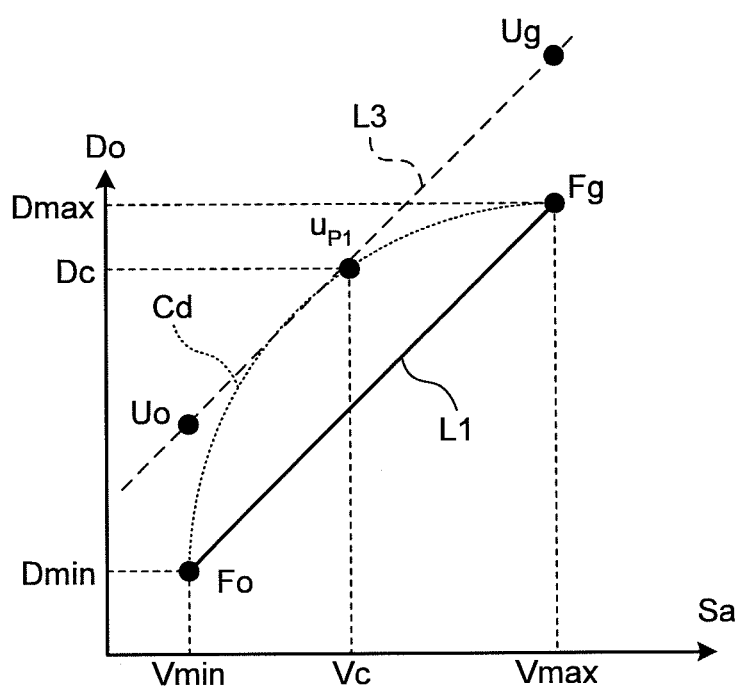
FIG. 4 shows a method of calibration of a third embodiment implemented in the analog unit according to the present invention.

FIG. 4 shows a method of calibration of a third embodiment implemented in the analog unit according to the present invention. As shown in FIG. 4, it is assumed that the output characteristics of an ADC code Cd are represented by a curve.

An ADC code Dmin given in response to application of an offset voltage Vmin to the A/D converter circuit 12 is measured as a factory offset value Fo, and an ADC code Dmax given in response to application of a gain voltage Vmax to the A/D converter circuit 12 is measured as a factory gain value Fg in a manufacturing factory of the A/D converter unit 11.

Further, an ADC code Dc given in response to application of an input voltage Vc to the A/D converter circuit 12 is measured as a user-measured value $u_{P1}$ at a site where the A/D converter unit 11 is used, and is then stored in the temporary memory 16 of FIG. 1.

After the user-measured value $u_{P1}$ is stored in the temporary memory 16, the user-set value calculating part 15 calculates a straight line L1 that passes through the factory offset value Fo and the factory gain value Fg.

After calculating the straight line L1 that passes through the factory offset value Fo and the factory gain value Fg, the user-set value calculating part 15 calculates a straight line L3 which is parallel to the straight line L1 and passes through the user-measured value $u_{P1}$. Next, the user offset value Uo and the user gain value Ug are specified on the straight line L3, and are then stored in the nonvolatile memory 14.

Thus, the user-measured value $u_{P1}$ can be made the same as the digital output value Do by measuring one user-measured value $u_{P1}$ at the site where the A/D converter unit 11 is used. As a result, conversion accuracy can be enhanced in an area specified by a user and in the vicinity thereof while increase of man-hours required for measurement is prevented.

Fourth Embodiment

Figure 5:
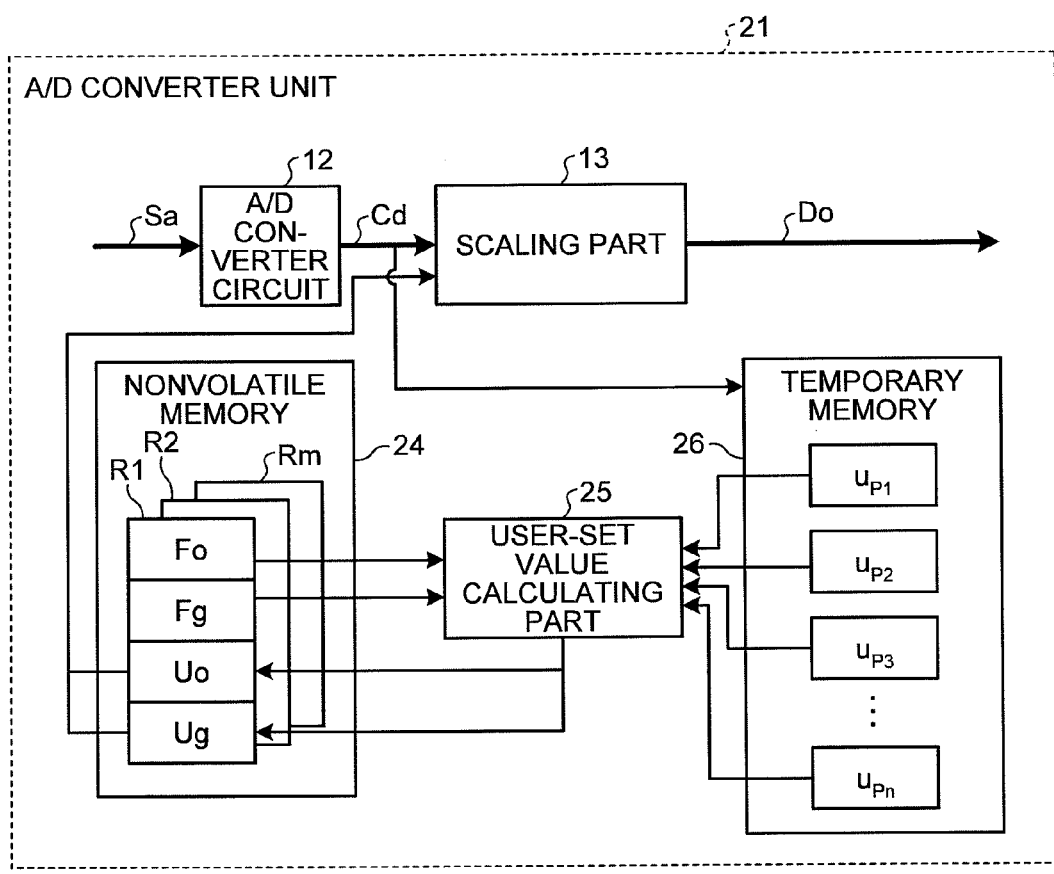
FIG. 5 is a block diagram of the schematic configuration of a fourth embodiment applied to the analog unit according to the present invention.

FIG. 5 is a block diagram of the schematic configuration of a fourth embodiment applied to the analog unit according to the present invention. An A/D converter unit 21 shown in FIG. 5 includes a nonvolatile memory 24, a user-set value calculating part 25, and a temporary memory 26 in place of the nonvolatile memory 14, the user-set value calculating part 15, and the temporary memory 16 of FIG. 1.

The nonvolatile memory 24 can store two factory-set values and two user-set values for each of user ranges R1 to Rm. The two factory-set values to be given may include a factory offset value Fo and a factory gain value Fg. The two user-set values to be given may include a user offset value Uo and a user gain value Ug.

The user-set value calculating part 25 can calculate the user offset value Uo and the user gain value Ug on the basis of three or more user-measured values $u_{P1}$ to $u_{Pn}$, and the factory offset value Fo and the factory gain value Fg, and store the calculated user offset value Uo and the user gain value Ug in the nonvolatile memory 24. The user-measured values $u_{P1}$ to $u_{Pn}$ can be measured at a site where a user uses the A/D converter unit 21. The user-measured values $u_{P1}$ to $u_{Pn}$ can represent a relationship between an analog input value Sa and an ADC code Cd (namely, a digital output value Do before calibration).

The temporary memory 26 can store the three or more user-measured values $u_{P1}$ to $u_{Pn}$ measured at the site where the user uses the A/D converter unit 21.

Next, the ADC code Cd given in response to input of the analog input value Sa to the A/D converter circuit 12 is measured at the site where the A/D converter unit 21 is used. Then, the user-measured values $u_{P1}$ to $u_{Pn}$ are measured, and are stored in the temporary memory 26.

After the user-measured values $u_{P1}$ to $u_{Pn}$ are stored in the temporary memory 26, the user-set value calculating part 25 calculates the user offset value Uo and the user gain value Ug on the basis of the user-measured values $u_{P1}$ to $u_{Pn}$, the factory offset value Fo, and the factory gain value Fg. The calculated user offset value Uo and the user gain value Ug are stored in the nonvolatile memory 24.

The analog input value Sa given to the A/D converter circuit 12 is converted to the ADC code Cd, and is then given to the scaling part 13. After the ADC code Cd is given to the scaling part 13, the ADC code Cd is scaled to the digital output value Do by referring to the user offset value Uo and the user gain value Ug stored in the nonvolatile memory 24.

Thus, the A/D converter unit 21 can be calibrated at the site where the A/D converter unit 11 is used by measuring the three or more user-measured values $u_{P1}$ to $u_{Pn}$. This can reduce unevenness in calibration accuracy even if the analog input value Sa and the ADC code Cd are correlated with each other in a nonlinear manner.

Fifth Embodiment

Figure 6:
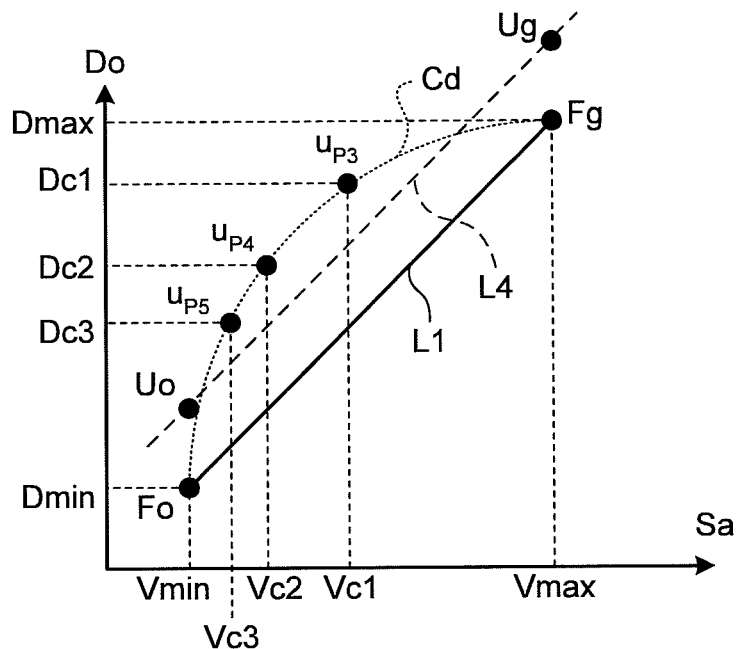
FIG. 6 shows a method of calibration of a fifth embodiment implemented in the analog unit according to the present invention.

FIG. 6 shows a method of calibration of a fifth embodiment implemented in the analog unit according to the present invention. As shown in FIG. 6, it is assumed that the output characteristics of an ADC code Cd are represented by a curve.

An ADC code Dmin given in response to application of an offset voltage Vmin to the A/D converter circuit 12 is measured as the factory offset value Fo, and an ADC code Dmax given in response to application of a gain voltage Vmax to the A/D converter circuit 12 is measured as the factory gain value Fg in a manufacturing factory of the A/D converter unit 21.

Further, an ADC code Dc1 given in response to application of an input voltage Vc1 to the A/D converter circuit 12 is measured as a user-measured value $u_{P3}$ at a site where the A/D converter unit 21 is used, and is then stored in the temporary memory 26 of FIG. 5. An ADC code Dc2 given in response to application of an input voltage Vc2 to the A/D converter circuit 12 is also measured as a user-measured value $u_{P4}$ at the site where the A/D converter unit 21 is used, and is then stored in the temporary memory 26 of FIG. 5. An ADC code Dc3 given in response to application of an input voltage Vc3 to the A/D converter circuit 12 is also measured as a user-measured value $u_{P5}$ at the site where the A/D converter unit 21 is used, and is then stored in the temporary memory 26 of FIG. 5.

After the user-measured values $u_{P3}$ to $u_{P5}$ are stored in the temporary memory 26, the user-set value calculating part 25 calculates a straight line L4 along which a residual sum of squares between each of the factory offset value Fo and the factory gain value Fg, and each of the user-measured values $u_{P3}$ to $u_{P5}$ is minimized. Next, the user offset value Uo and the user gain value Ug are specified on the straight line L4, and are then stored in the nonvolatile memory 24.

Thus, a margin of error can be made small throughout the range by measuring three or more user-measured values $u_{P3}$ to $u_{P5}$ at the site where the A/D converter unit 21 is used. As a result, conversion accuracy throughout the range of the A/D converter unit 21 can be kept at a constant level even if an analog input value Sa and the ADC code Cd are correlated with each other in a nonlinear manner.

The example of FIG. 6 describes the method of obtaining the straight light L4 along which a residual sum of squares between each of the factory offset value Fo and the factory gain value Fg, and each of the three user-measured values $u_{P3}$ to $u_{P5}$ is minimized. Meanwhile, a straight line to be obtained may be such a straight line that minimizes a residual sum of squares between each the factory offset value Fo and the factory gain value Fg, and each of four or more user-measured values.

Sixth Embodiment

Figure 7:
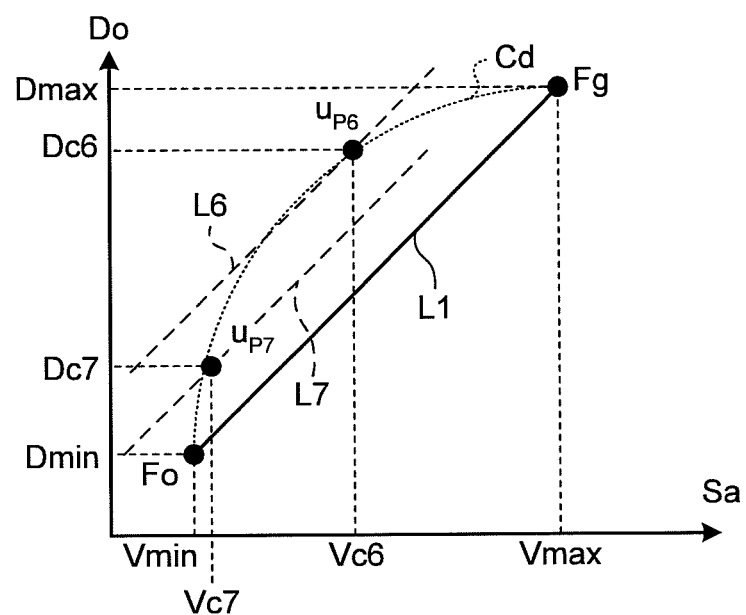
FIG. 7 shows a method of calibration of a sixth embodiment implemented in the analog unit according to the present invention.

FIG. 7 shows a method of calibration of a sixth embodiment implemented in the analog unit according to the present invention. As shown in FIG. 7, it is assumed that the output characteristics of an ADC code Cd are represented by a curve.

An ADC code Dmin given in response to application of an offset voltage Vmin to the A/D converter circuit 12 is measured as a factory offset value Fo, and an ADC code Dmax given in response to application of a gain voltage Vmax to the A/D converter circuit 12 is measured as a factory gain value Fg in a manufacturing factory of the A/D converter unit 21.

Further, an ADC code Dc6 given in response to application of an input voltage Vc6 to the A/D converter circuit 12 is measured as a user-measured value $u_{P6}$ an a site where the A/D converter unit 21 is used, and is then stored in the temporary memory 26 of FIG. 5. An ADC code Dc7 given in response to application of an input voltage Vc7 to the A/D converter circuit 12 is also measured as a user-measured value $u_{P7}$ at the site where the A/D converter unit 21 is used, and is then stored in the temporary memory 26 of FIG. 5.

After the user-measured values $u_{P6}$ and $u_{P7}$ are stored in the temporary memory 26, the user-set value calculating part 25 calculates a straight line L1 that passes through the factory offset value Fo and the factory gain value Fg. After calculating the straight line L1 that passes through the factory offset value Fo and the factory gain value Fg, the user-set value calculating part 25 calculates a straight line L6 which is parallel to the straight line L1 and passes through the user-measured value $u_{P6}$. At the same time, the user-set value calculating part 25 also calculates a straight line L7 which is parallel to the straight line L1 and passes through the user-measured value $u_{P7}$. Next, a user offset value Uo and a user gain value Ug are specified on the straight lines L6 and L7, and are then stored in the nonvolatile memory 24.

The scaling part 13 of FIG. 5 can make selection according to an analog input value Sa between the straight lines L6 and L7 on which the user offset value Uo and the user gain value Ug are specified, and use the selected straight line for calibration.

Thus, the user-measured values $u_{P6}$ and $u_{P7}$ can be made the same as a digital output value Do, so that conversion accuracy can be enhanced in an area specified by a user and in the vicinity thereof.

The example of FIG. 7 describes the method of obtaining the straight lines L6 and L7 that pass through the two user-measured values $u_{P6}$ and $u_{P7}$, selecting one of the straight lines L6 and L7 according to the analog input value Sa, and using the selected straight line for calibration. Meanwhile, straight lines that pass through different ones of three or more user-measured values may be obtained. In this case, selection may be made according to the analog input value Sa from among these straight lines, and the selected straight line may be used for calibration.

Seventh Embodiment

Figure 8:
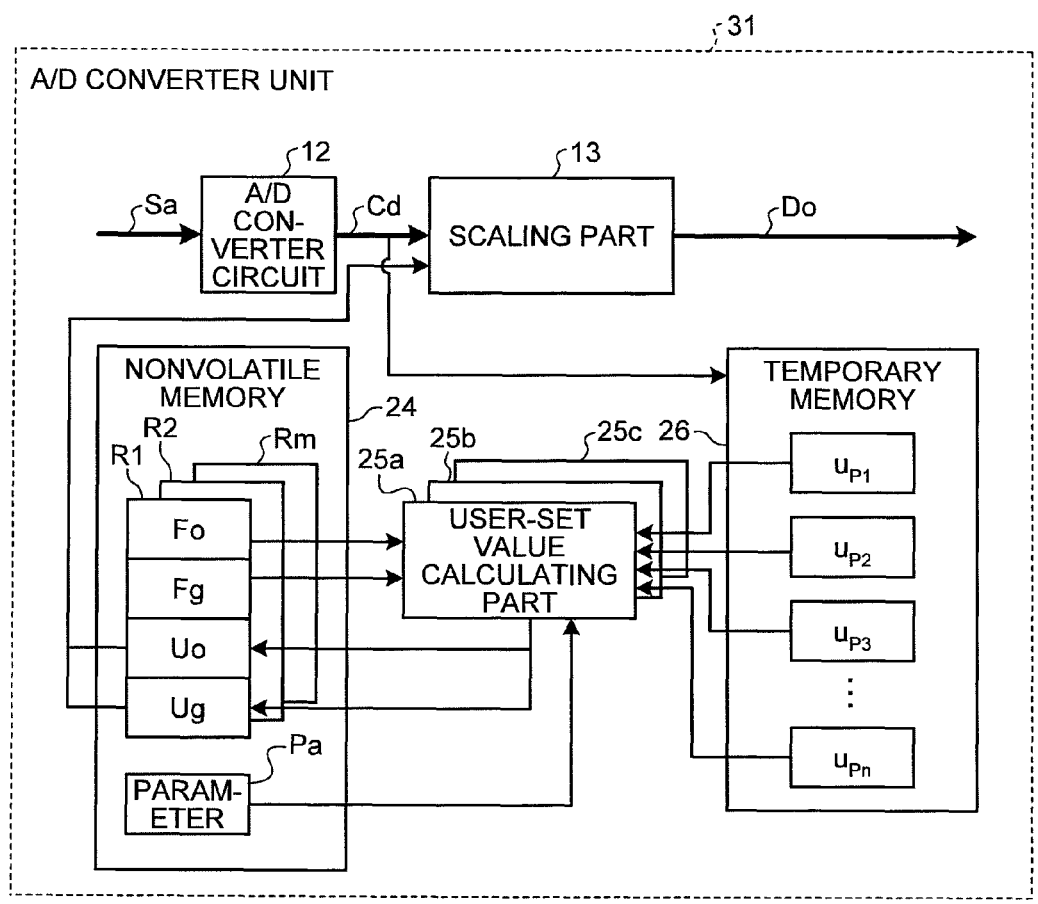
FIG. 8 is a block diagram of the schematic configuration of a seventh embodiment applied to the analog unit according to the present invention.

FIG. 8 is a block diagram of the schematic configuration of a seventh embodiment applied to the analog unit according to the present invention. An A/D converter unit 31 shown in FIG. 8 includes a plurality of user-set value calculating parts 25a to 25c in place of the user-set value calculating part 25 of FIG. 5. At the same time, the nonvolatile memory 24 additionally stores a parameter Pa. The user-set value calculating parts 25a to 25c can calculate a user offset value Uo and a user gain value Ug on the basis of one or more user-measured values $u_{P1}$ to $u_{Pn}$, a factory offset value Fo, and a factory gain value Fg by employing different ways of calculation. As an example, the user-set value calculating part 25a can calculate the user offset value Uo and the user gain value Ug by employing the method explained in FIG. 3. Further, the user-set value calculating part 25b may calculate the user offset value Uo and the user gain value Ug by employing the method explained in FIG. 6. Furthermore, the user-set value calculating part 25c may calculate the user offset value Uo and the user gain value Ug by employing the method explained in FIG. 7.

The parameter Pa can designate the user-set value calculating part 25a, 25b or 25c to calculate the user offset value Uo and the user gain value Ug.

After the user-set value calculating part 25a, 25b or 25c is designated by the parameter Pa, the designated user-set value calculating part 25a, 25b or 25c calculates the user offset value Uo and the user gain value Ug, and stores the calculated user offset value Uo and the user gain value Ug in the nonvolatile memory 24.

As described above, setting of the parameter Pa can reduce man-hours required for measurement, make a margin of error equal throughout the range, and enhance conversion accuracy in an area specified by a user and in the vicinity thereof. Thus, usage can be changed in various ways according to the condition of a site of use.

Eighth Embodiment

Figure 9:
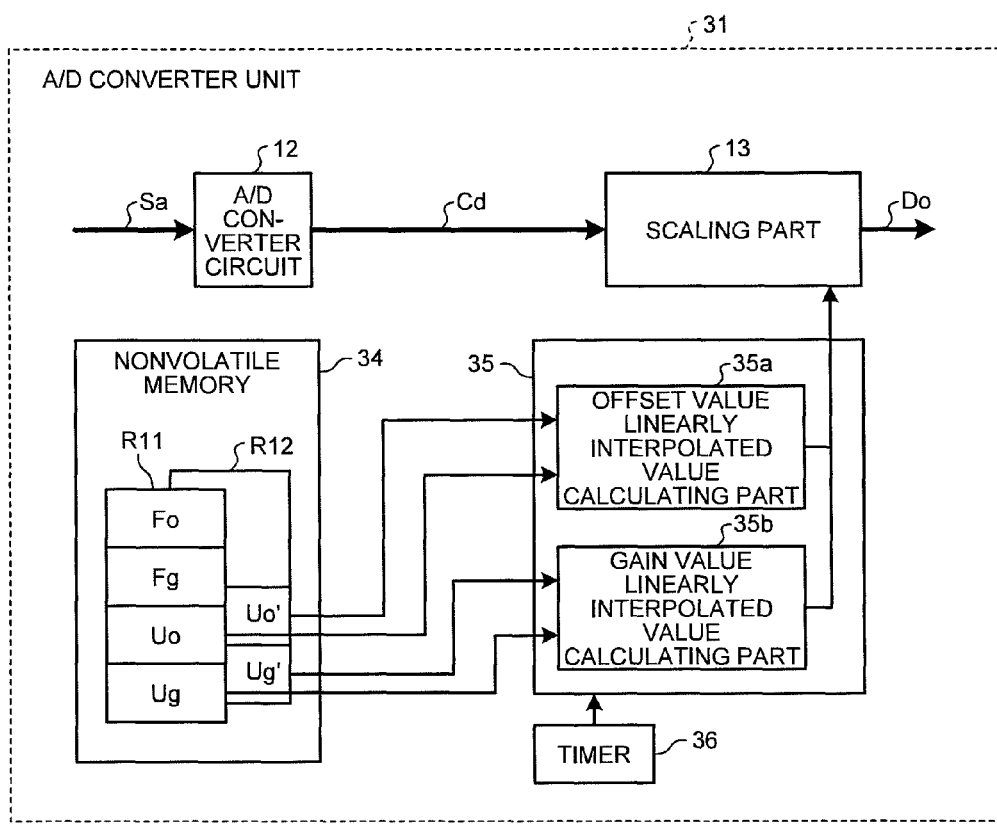
FIG. 9 is a block diagram of the schematic configuration of an eighth embodiment applied to the analog unit according to the present invention.

FIG. 9 is a block diagram of the schematic configuration of an eighth embodiment applied to the analog unit according to the present invention. An A/D converter unit 31 shown in FIG. 9 includes a nonvolatile memory 34, a set value linear interpolating part 35, and a timer 36 in place of the nonvolatile memory 14, the user-set value calculating part 15, and the temporary memory 16 of FIG. 1.

The nonvolatile memory 34 can store two factory-set values and two user-set values in a memory region R11. The two factory-set values stored in the memory region R11 to be given may include a factory offset value Fo and a factory gain value Fg. The two user-set values stored in the memory region R11 to be given may include a user offset value Uo and a user gain value Ug. The user offset value Uo may be an ADC code to be output in response Lo application of an offset voltage to the A/D converter circuit 12 at a site of use when the temperature of the A/D converter circuit 12 is in a stationary state. The user gain value Ug may be an ADC code to be output in response to application of a gain voltage to the A/D converter circuit 12 at the site of use when the temperature of the A/D converter circuit 12 is in the stationary state.

The nonvolatile memory 34 can store two user-set values in a memory region R12. The two user-set values stored in the memory region R12 to be given may include a user offset value Uo' and a user gain value Ug'. The user offset value Uo' may be an ADC code to be output in response to application of an offset voltage to the A/D converter circuit 12 at the site of use when the temperature of the A/D converter circuit 12 is in an initial state. The user gain value Ug' may be an ADC code to be output in response to application of a gain voltage to the A/D converter circuit 12 at the site of use when the temperature of the A/D converter circuit 12 is in the initial state.

The initial state of the temperature of the A/D converter circuit 12 may include a state immediately after the A/D converter unit 31 is turned on.

The set value linear interpolating part 35 can interpolate a user-set value to be applied in a period during which the temperature of the A/D converter circuit 12 changes from the initial state to the stationary state on the basis of elapsed time measured by the timer 36. The set value linear interpolating part 35 includes an offset value linearly interpolated value calculating part 35a and a gain value linearly interpolated value calculating part 35b. The offset value linearly interpolated value calculating part 35a can linearly interpolate a user offset value Uo" between the user offset values Uo and Uo' on the basis of elapsed time measured by the timer 36. The gain value linearly interpolated value calculating part 35b can linearly interpolate a user gain value Ug" between the user gain values Ug and Ug' on the basis of elapsed time measured by the timer 36.

The timer 36 can measure elapsed time after the A/D converter unit 31 is turned on. The scaling part 13, the nonvolatile memory 34, the set value linear interpolating part 35, and the timer 36 may be realized by a microcomputer.

When the A/D converter unit 31 is turned on at a time T1, an analog input value Sa is converted in the A/D converter circuit 12 to an ADC code Cd, and is then given to the scaling part 13. At the same time, the timer 36 starts time measurement. The user offset value Uo' is given through the offset value linearly interpolated value calculating part 35a to the scaling part 13, and the user gain value Ug' is given through the gain value linearly interpolated value calculating part 35b to the scaling part 13 at the time T1.

After the ADC code Cd is given to the scaling part 13 at the time T1, the ADC code Cd is scaled to a digital output value Do by referring to the user offset value Uo' and the user gain value Ug'.

As the time measurement by the timer 36 proceeds, the offset value linearly interpolated value calculating part 35a linearly interpolates the user offset value Uo" between the user offset values Uo and Uo' on the basis of elapsed time measured by the timer 36 at a time T2. At the same time, the gain value linearly interpolated value calculating part 35b linearly interpolates the user gain value Ug" between the user gain values Ug and Ug' on the basis of the elapsed time measured by the timer 36 at the time T2. Then, the user offset value Uo" and the user gain value Ug" are given to the scaling part 13.

After the ADC code Cd is given to the scaling part 13 at the time T2, the ADC code Cd is scaled to the digital output value Do by referring to the user offset value Uo" and the user gain value Ug".

If it is determined at a time 13 that the temperature of the A/D converter circuit 12 is in the stationary state on the basis of elapsed time measured by the timer 36, the user offset value Uo is given through the offset value linearly interpolated value calculating part 35a to the scaling part 13. At the same time, the user gain value Ug is given through the gain value linearly interpolated value calculating part 35b to the scaling part 13.

When the ADC code Cd is given to the scaling part 13 at the time T3, the ADC code Cd is scaled to the digital output value Do by referring to the user offset value Uo and the user gain value Ug.

Accordingly, the digital output value Do can be corrected in response to a temperature drift without involving addition of a component part if the scaling part 13, the nonvolatile memory 34, the set value linear interpolating part 35, and the timer 36 are realized by a microcomputer. This can improve the A/D conversion accuracy of the A/D converter unit 31 while preventing cost increase of the A/D converter unit 31.

Figure 10:
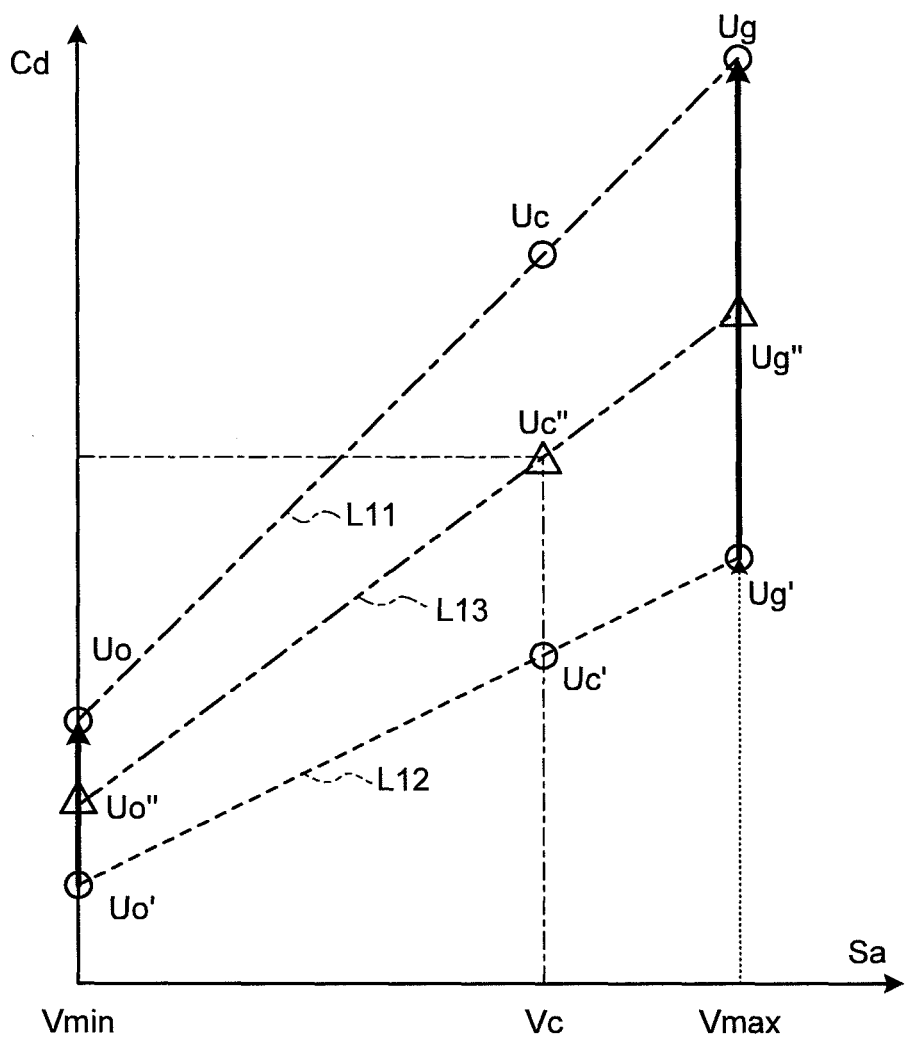
FIG. 10 shows a method of correcting a temperature drift implemented in the analog unit of FIG. 9.

FIG. 10 shows a method of correcting a temperature drift implemented in the analog unit of FIG. 9. As shown in FIG. 10, it is assumed that a straight line L11 passes through the user offset value Uo and the user gain value Ug, and a straight line L12 passes through the user offset value Uo' and the user gain value Ug'. Further, it is assumed that the A/D converter unit 31 is turned on at the time T1. In this case, after an ADC code Uo' is given to the scaling part 13 at the time T1 in response to an input voltage Vc, the ADC code Uc' is scaled by referring to the user offset value Uo' and the user gain value Ug'.

After an ADC code Uc" is given to the scaling part 13 at the time T2 in response to the input voltage Vc, the user offset value Uo" is linearly interpolated between the user offset values Uo and Uo' on the basis of elapsed time measured by the timer 36. At the same time, the user gain value Ug" is linearly interpolated between the user gain values Ug and Ug'. As a result, a straight line L13 is obtained between the straight lines L11 and L12.

Next, the scaling part 13 refers to the user offset value Uo" and the user gain value Ug", thereby scaling the ADC code Uo".

After an ADC code Uo is given to the scaling part 13 at the time T3 in response to the input voltage Vc, the ADC code Uc is scaled by referring to the user offset value Uo and the user gain value Ug.

Ninth Embodiment

Figure 11:
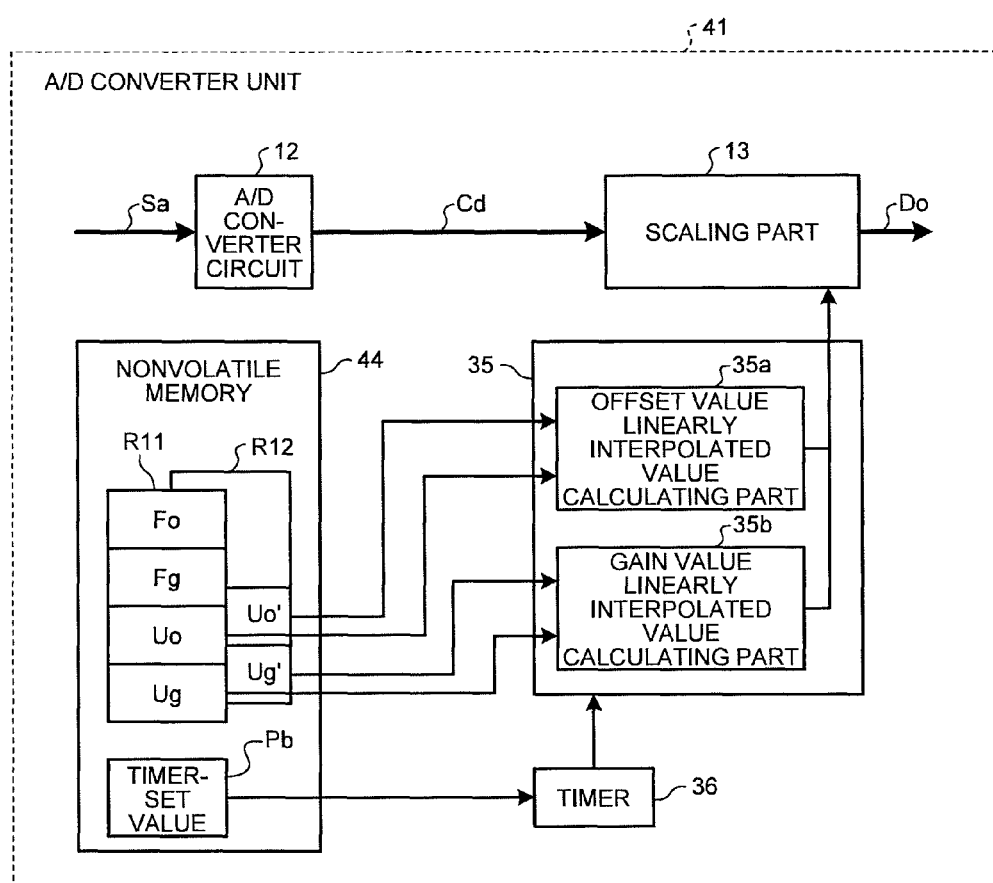
FIG. 11 is a block diagram of the schematic configuration of a ninth embodiment applied to the analog unit according to the present invention.

FIG. 11 is a block diagram of the schematic configuration of a ninth embodiment applied to the analog unit according to the present invention. An A/D converter unit 41 shown in FIG. 11 includes a nonvolatile memory 44 in place of the nonvolatile memory 34 of FIG. 9. At the same time, the nonvolatile memory 44 additionally stores a timer-set value Pb.

The timer-set value Pb can specify time from when the A/D converter unit 41 is turned on to when the temperature of the A/D converter circuit 12 is in a stationary state.

After time to when the temperature of the A/D converter circuit 12 is in the stationary state is specified as the timer-set value Pb, it is determined if time measured by the timer 36 reaches the timer-set value Pb. By the time when the time measured by the timer 36 reaches the timer-set value Pb, the offset value linearly interpolated value calculating part 35a linearly interpolates a user offset value Uo" between user offset values Uo and Uo' on the basis of elapsed time measured by the timer 36. At the same time, the gain value linearly interpolated value calculating part 35b linearly interpolates a user gain value Ug" between user gain values Ug and Ug' on the basis of the elapsed time measured by the timer 36. Then, the user offset value Uo" and the user gain value Ug" are given to the scaling part 13.

When the time measured by the timer 36 reaches the timer-set value Pb, the user offset value Uo is given through the offset value linearly interpolated value calculating part 35a to the scaling part 13, and the user gain value Ug is given through the gain value linearly interpolated value calculating part 35b to the scaling part 13.

Thus, even if time from when the A/D converter unit 41 is turned on to when the temperature of the A/D converter circuit 12 is in the stationary state varies depending on the environment of usage, determination as to whether the temperature of the A/D converter circuit 12 is in the stationary state can be made accurately. As a result, accuracy in correction in response to a temperature drift can be improved.

Tenth Embodiment

Figure 12:
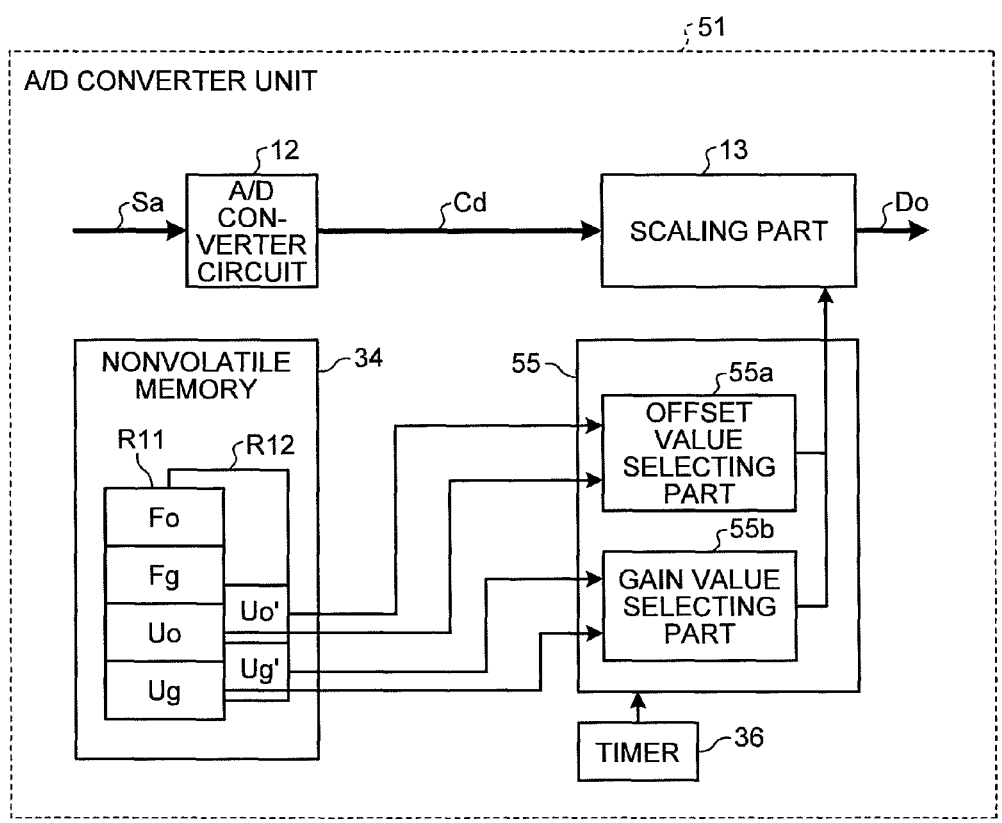
FIG. 12 is a block diagram of the schematic configuration of a tenth embodiment applied to the analog unit according to the present invention.

FIG. 12 is a block diagram of the schematic configuration of a tenth embodiment applied to the analog unit according to the present invention. An A/D converter unit 51 shown in FIG. 12 includes a set value selecting part 55 in place of the set value linear interpolating part 35 of FIG. 9.

The set value selecting part 55 can select a user-set value applied when the temperature of the A/D converter circuit 12 is in a stationary state, or a user-set value applied when the temperature of the A/D converter circuit 12 is in an initial state on the basis of elapsed time measured by the timer 36. The set value selecting part 55 includes an offset value selecting part 55a and a gain value selecting part 55b. The offset value selecting part 55a can select a user offset value Uo applied when the temperature of the A/D converter circuit 12 is in the stationary state, or a user offset value Uo' applied when the temperature of the A/D converter circuit 12 is in the initial state on the basis of elapsed time measured by the timer 36. The gain value selecting part 55b can select a user gain value Ug applied when the temperature of the A/D converter circuit 12 is in the stationary state, or a user gain value Ug' applied when the temperature of the A/D converter circuit 12 is in the initial state on the basis of elapsed time measured by the timer 36.

When the A/D converter unit 51 is turned on at a time T11, an analog input value Sa is converted in the A/D converter circuit 12 to an ADC code Cd, and is then given to the scaling part 13. At the same time, the timer 36 starts time measurement. By the time it is determined that the temperature of the A/D converter circuit 12 is in the stationary state, the offset value selecting part 55a selects a user offset value Uo', and gives the user offset value Uo' to the scaling part 13. At the same time, the gain value selecting part 55b selects a user gain value Ug', and gives the user gain value Ug' to the scaling part 13.

By the time it is determined that the temperature of the A/D converter circuit 12 is in the stationary state, the ADC code Cd is given to the scaling part 13 to be scaled to a digital output value Do by referring to the user offset value Uo' and the user gain value Ug'.

When it is determined at a time T12 that the temperature of the A/D converter circuit 12 is in the stationary state on the basis of elapsed time measured by the timer 36, the offset value selecting part 55a selects the user offset value Uo, and gives the user offset value Uo to the scaling part 13. At the same time, the gain value selecting part 55b selects the user gain value Ug, and gives the user gain value Ug to the scaling part 13.

After it is determined that the temperature of the A/D converter circuit 12 is in the stationary state, the ADC code Cd is given to the scaling part 13 to be scaled to the digital output value Do by referring to the user offset value Uo and the user gain value Ug.

Accordingly, the digital output value Do can be corrected in response to a temperature drift without involving addition of a component part if the scaling part 13, the nonvolatile memory 34, the set value selecting part 55, and the timer 36 are realized by a microcomputer. This can improve the A/D conversion accuracy of the A/D converter unit 51 while preventing cost increase of the A/D converter unit 51.

Figure 13:
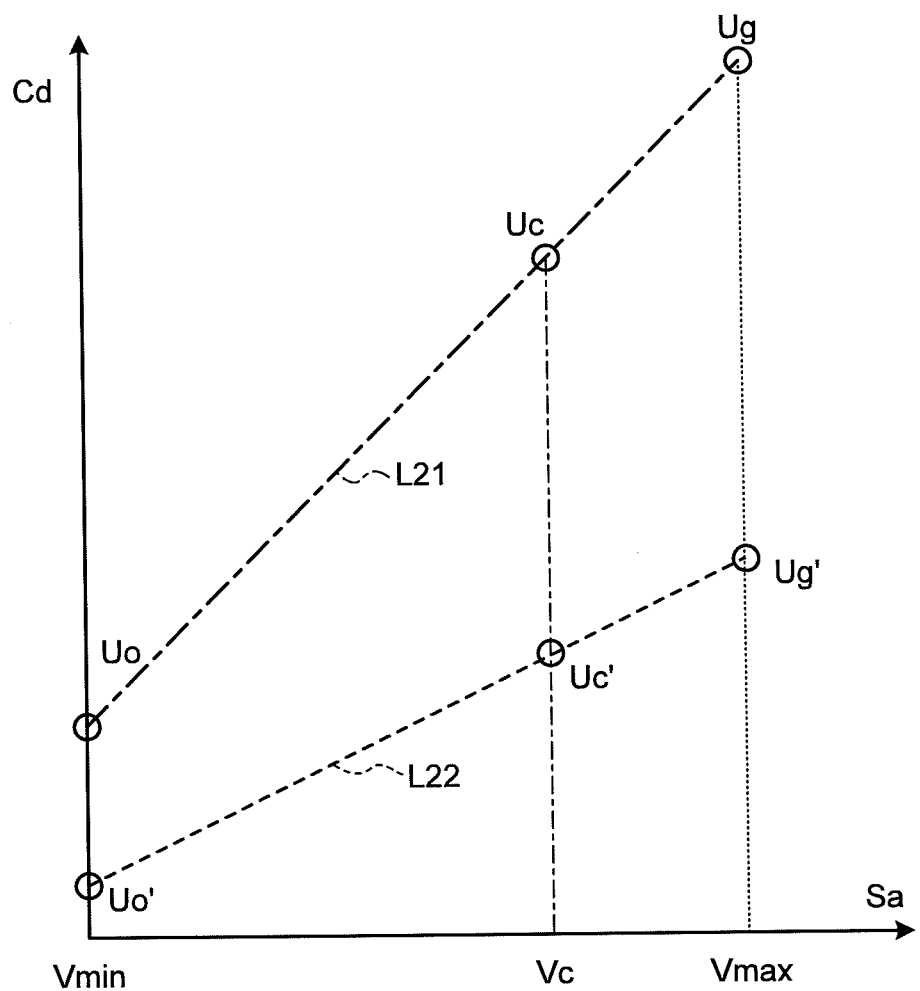
FIG. 13 shows a method of correcting a temperature drift implemented in the analog unit of FIG. 12.

FIG. 13 shows a method of correcting a temperature drift implemented in the analog unit of FIG. 12. As shown in FIG. 13, it is assumed that a straight line L21 passes through the user offset value Uo and the user gain value Ug, and a straight line L22 passes through the user offset value Uo' and the user gain value Ug'. Further, it is assumed that the A/D converter unit 51 is turned on at the time T11. After an ADC code Uc' is given to the scaling part 13 at the time T11 in response to an input voltage Vc, the ADC code Uc' is scaled by referring to the user offset value Uo' and the user gain value Ug'.

After an ADC code Uc is given to the scaling part 13 at the time T12 in response to the input voltage Vc, the ADC code Uc is scaled by referring to the user offset value Uo and the user gain value Ug.

As in the embodiment shown in FIG. 11, in the A/D converter unit 51 of FIG. 12, the nonvolatile memory 44 may store the timer-set value Pb, so that time from when the A/D converter unit 51 is turned on to when the temperature of the A/D converter circuit 12 is in the stationary state can be specified.

Eleventh Embodiment

Figure 14:
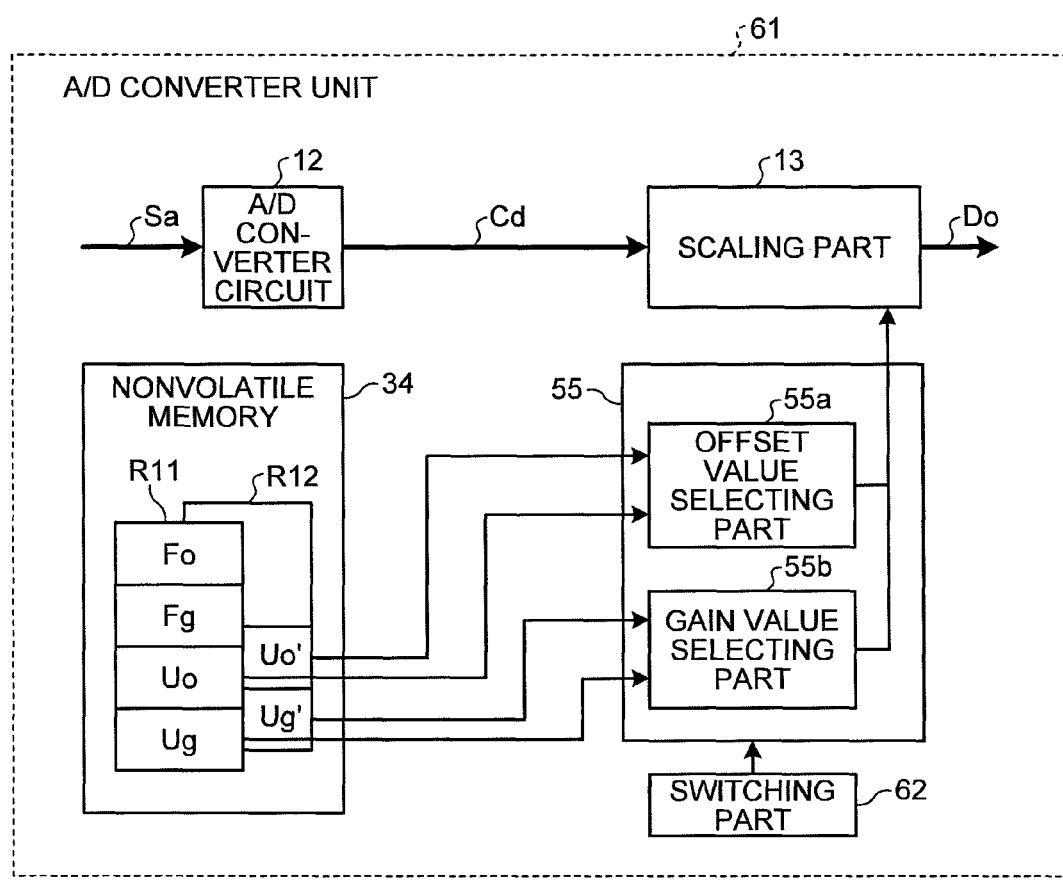
FIG. 14 is a block diagram of the schematic configuration of an eleventh embodiment applied to the analog unit according to the present invention.

FIG. 14 is a block diagram of the schematic configuration of an eleventh embodiment applied to the analog unit according to the present invention. An A/D converter unit 61 shown in FIG. 14 includes a switching part 62 in place of the timer 36 of FIG. 12.

The switching part 62 can cause the offset value selecting part 55a to select a user offset value Uo or a user offset value Uo' in response to an external trigger. At the same time, the switching part 62 can also cause the gain value selecting part 55b to select a user gain value Ug or a user gain value Ug' in response to an external trigger.

When the A/D converter unit 61 is turned on at a time T21, the analog input value Sa is converted in the A/D converter circuit 12 to an ADC code Cd, and is then given to the scaling part 13. Then, the offset value selecting part 55a selects the user offset value Uo', and gives the user offset value Uo' to the scaling part 13. At the same time, the gain value selecting part 55b selects the user gain value Ug', and gives the user gain value Ug' to the scaling part 13.

When an external trigger is given to the switching part 62 at a time T22, the offset value selecting part 55a selects the user offset value Uo, and gives the user offset value Uo to the scaling part 13. At the same time, the gain value selecting part 55b selects the user gain value Ug, and gives the user gain value Ug to the scaling part 13.

Accordingly, even if the A/D converter unit 61 is restarted while the temperature of the A/D converter unit 61 is in a stationary state, the user offset value Co and the user gain value Ug can be given to the scaling part 13 without the need to wait for elapse of time from turn-on of the A/D converter unit 61. As a result, accuracy in correction in response to a temperature drift can be improved.

Twelfth Embodiment

Figure 15:
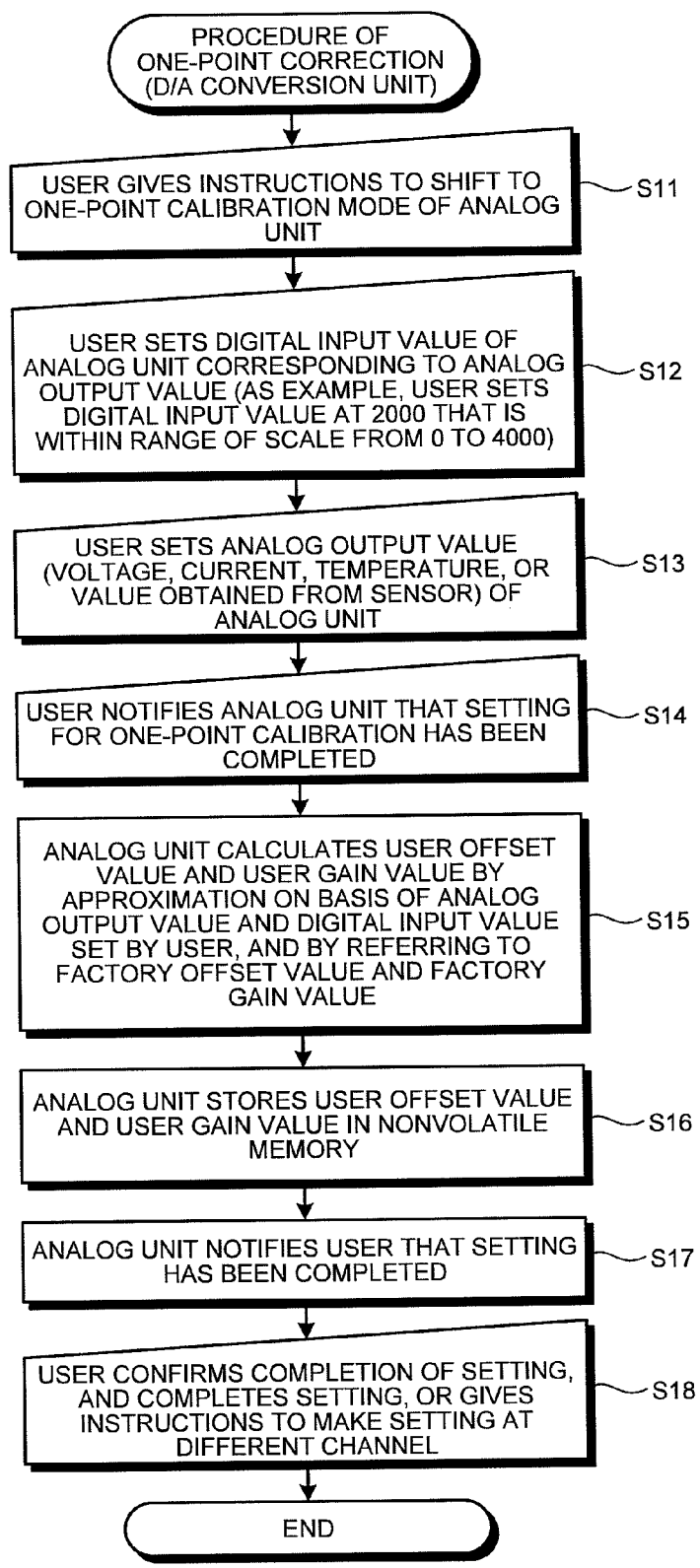
FIG. 15 shows a method of calibration of a twelfth embodiment implemented in the analog unit according to the present invention.

FIG. 15 shows a method of calibration of a twelfth embodiment implemented in the analog unit according to the present invention. As shown in FIG. 15, at a site where a user uses the analog unit (in this example, D/A converter unit), the user gives instructions to shift to a one-point calibration mode of the analog unit (step S11).

Next, the user sets a digital input value of the analog unit corresponding to an analog output value (step S12). As an example, the user may set the digital input value at 2000 that is within a range of scale from 0 to 4000.

Next, the user sets the analog output value of the analog unit (step S13). The analog output value may be a value obtained from various sensors such as a temperature sensor. Further, the analog output value may be represented as a voltage or a current.

The user thereafter notifies the analog unit that setting for the one-point calibration has been completed (step S14).

Next, while referring to a factory offset value and a factory gain value stored in a nonvolatile memory, the analog unit calculates a user offset value and a user gain value on the basis of the analog output value and the digital input value set by the user (step S15).

The analog unit thereafter stores the user offset value and the user gain value in the nonvolatile memory (step S16).

Next, the analog unit notifies the user that setting of the user offset value and the user gain value has been completed (step S17).

The user thereafter confirms that the setting of the user offset value and the user gain value has been completed. Then, the user instructs the analog unit to make setting at a different channel (step S18).

Accordingly, even if a D/A converter unit is used as the analog unit, the conversion accuracy of the D/A converter unit can still be improved while increase of man-hours required for measurement is still prevented.

INDUSTRIAL APPLICABILITY

As described above, the analog unit according to the present invention can prevent increase of man-hours required for measurement during calibration even if an analog signal and an ADC code are correlated with each other in a nonlinear manner, and is suitably applied to a method of calibrating an output value of the analog unit.

REFERENCE SIGNS LIST 11, 21, 31, 41, 51, 61 A/D converter unit
12 A/D converter circuit
13 scaling part
14, 24, 44 nonvolatile memory
15, 25, 25a-25c user-set value calculating part
16, 26 temporary memory
35 set value linear interpolating part
35a offset value linearly interpolated value calculating part
35b gain value linearly interpolated value calculating part
36 timer
55 set value selecting part
55a offset value selecting part
55b gain value selecting part
62 switching part

The invention claimed is:

1. An analog unit, comprising:
a converter circuit for converting an input value to an output value;
a storage part for storing two factory-set values representing a relationship between the input value and the output value before calibration; and
a user-set value calculating part for calculating two user-set values representing a relationship between the input value and the output value after calibration on the basis of one user-measured value representing the relationship between the input value and the output value before calibration, and the two factory-set values, and
wherein the user-set value calculating part specifies the two user-set values on a straight line along which a residual sum of squares between each of the two factory-set values and the one user-measured value is minimized.

2. The analog unit according to claim 1, wherein the user-set value calculating part selects a method of calculating the user-set values designated by a parameter.

3. An analog unit, comprising:
a converter circuit for converting an input value to an output value;
a storage part for storing two factory-set values representing a relationship between the input value and the output value before calibration; and
a user-set value calculating part for calculating two user-set values representing a relationship between the input value and the output value after calibration on the basis of one user-measured value representing the relationship between the input value and the output value before calibration, and the two factory-set values, and
wherein the user-set value calculating part specifies the two user-set values on a second straight line parallel to a first straight line obtained from the two factory-set values, the second straight line passing through the one user-measured value.

4. An analog unit, comprising:
a converter circuit for converting an input value to an output value;
a storage part for storing two factory-set values representing a relationship between the input value and the output value before calibration; and
a user-set value calculating part for calculating two user-set values representing a relationship between the input value and the output value after calibration on the basis of three or more user-measured values representing the relationship between the input value and the output value before calibration, and the two factory-set values, and
wherein the user-set value calculating part specifies the two user-set values on a straight line along which a residual sum of squares between each of the two factory-set values and each of the three or more user-measured values is minimized.

5. The analog unit according to claim 4, wherein the user-set value calculating part selects a method of calculating the user-set values designated by a parameter.

6. An analog unit, comprising:
a converter circuit for converting an input value to an output value;
a storage part for storing two factory-set values representing a relationship between the input value and the output value before calibration; and
a user-set value calculating part for calculating two user-set values representing a relationship between the input value and the output value after calibration on the basis of three or more user-measured values representing the relationship between the input value and the output value before calibration, and the two factory-set values, and
wherein the user-set value calculating part specifies the user-set values on a second straight line passing through a first user-measured value and on a third straight line passing through a second user-measured value, the second and third straight lines being parallel to a first straight line obtained from the two factory-set values.

7. An analog unit, comprising:
a converter circuit for converting an input value to an output value;
a storage part for storing set values at two points in time from when a temperature of the converter circuit is in an initial state to when the temperature of the converter circuit is in a stationary state, the set values indicating a relationship between the input value and the output value; and
a calibrating part for calibrating an output value of the converter circuit on the basis of the set values stored in the storage part, and
a set value linear interpolating part for interpolating the set values at the two points in time stored in the storage part based on elapsed time measured by the timer.

8. The analog unit according to claim 7 further comprising a timer for measuring elapsed time after power-on.

9. The analog unit according to claim 7, comprising:
a timer for measuring elapsed time after power-on; and
a set value selecting part for selecting a set value to be used for the calibration on the basis of elapsed time measured by the timer, the set value to be used being selected from the set values at the two points in time stored in the storage part.

10. The analog unit according to claim 7, wherein a timer-set value corresponding to time at when the temperature of the converter circuit is in the stationary state is switched, and is given to the timer.

11. The analog unit according to claim 7, further comprising a switching part for switching the set value to be used for the calibration to a set value defined when the temperature of the converter circuit is in the stationary state, the switching being made in response to a trigger applied from outside.

* * * * *